(12) United States Patent
Dupuis et al.

(10) Patent No.: US 8,022,766 B2
(45) Date of Patent: Sep. 20, 2011

(54) CMOS POWER AMPLIFIERS HAVING INTEGRATED ONE-TIME PROGRAMMABLE (OTP) MEMORIES

(75) Inventors: Timothy J. Dupuis, West Lake Hills, TX (US); Abhay Misra, Austin, TX (US)

(73) Assignee: Javelin Semiconductor, Inc., Austin, TX (US)

( * ) Notice: Subject to any disclaimer, the term of this patent is extended or adjusted under 35 U.S.C. 154(b) by 0 days.

(21) Appl. No.: 12/657,996

(22) Filed: Feb. 1, 2010

(65) Prior Publication Data

US 2011/0187460 A1   Aug. 4, 2011

(51) Int. Cl.
*H03G 3/10* (2006.01)
(52) U.S. Cl. .................. 330/285; 330/310; 330/305
(58) Field of Classification Search .................. 330/285, 330/305, 310–311, 98, 133, 150
See application file for complete search history.

(56) References Cited

U.S. PATENT DOCUMENTS

| | | | |
|---|---|---|---|
| 6,603,351 B2 | 8/2003 | Suzuki | 330/133 |
| 7,499,353 B2 | 3/2009 | Kim et al. | 365/200 |
| 7,512,028 B2 | 3/2009 | Archibald et al. | 365/225.7 |
| 7,567,129 B2 * | 7/2009 | Rohani et al. | 330/305 |
| 7,915,961 B1 | 3/2011 | Li | 330/297 |
| 7,948,324 B2 | 5/2011 | Buer et al. | 330/310 |
| 2004/0224649 A1 | 11/2004 | Shamsaifar | 455/107 |
| 2009/0273397 A1 | 11/2009 | Bockelman et al. | 330/51 |
| 2009/0278609 A1 | 11/2009 | Srinivasan et al. | 330/297 |
| 2010/0219887 A1 | 9/2010 | Ichitsubo et al. | 330/124 |

* cited by examiner

*Primary Examiner* — Hieu Nguyen
(74) *Attorney, Agent, or Firm* — O'Keefe, Egan, Peterman & Enders, LLP

(57) ABSTRACT

CMOS power amplifiers (PAs) are disclosed having one or more integrated one-time programming (OTP) memories that are utilized to control at least in part operation of the CMOS PAs. The integrated OTP memories within the CMOS power amplifiers (PAs) allow adjustments, such as one-time factory trimming, of CMOS PA integrated circuits to optimize or improve performance. With this capability, for example, the tuning and biasing of stages within a multi-stage amplifier within a CMOS PA can be measured during factory test and adjusted by setting one or more bits in the OTP memories, as desired. Further, the operation of other circuitry within the PA can also be controlled at least in part with parameter settings stored in the OTP memories.

25 Claims, 4 Drawing Sheets

CMOS POWER AMPLIFIERS HAVING INTEGRATED ONE-TIME PROGRAMMABLE (OTP) MEMORIES

TECHNICAL FIELD OF THE INVENTION

This invention relates to radio frequency (RF) power amplifiers and, more particularly, to the tuning of amplifier stages for RF power amplifiers.

BACKGROUND

Radio frequency (RF) power amplifiers (PAs) are used to produce higher output power levels for signals transmitted by wireless devices, such as cellular telephone handsets. For these RF PAs, there are often a number of parameters that are set during manufacture in order to achieve optimum performance of the PA. For example, some RF PAs include multiple tuned amplifier stages. For optimum performance, the tuning of these stages must be set correctly. In addition to the settings for the tuning of these amplifier stages, it is also important to properly set the bias conditions for each of these amplifier stages.

FIG. 1 (Prior Art) is a block diagram for an embodiment 100 of multiple amplifier stages for a PA utilizing fixed tuning/biasing parameters. An RF input ($RF_{IN}$) 101 is received by an input match network 102 and then provided to multiple amplifier stages before being provided to the output match network 104. The output match network 104 provides the RF output ($RF_{OUT}$) 105 that is ultimately provided as a transmit signal to an antenna. As depicted, there are three amplifier stages. The first stage (STAGE 1) 106 receives an RF input from the input match network 102 and provides an output to the second stage (STAGE 2) 108. In turn, the second stage (STAGE 2) 108 receives the signal from the first stage (STAGE 1) 106 and provides an output to the third stage (STAGE 3) 110. Finally, the third stage (STAGE 3) 110 receives the signal from the second stage (STAGE 2) 108 and provides an output to the output match network 104.

As indicated above, multiple tuned circuits and bias regulators are typically associated with the multiple amplifier stages of a traditional PA. As depicted, a first tuned circuit 112 is coupled to node 113 between the output of the first stage (STAGE 1) 106 and the input of the second stage (STAGE 2) 108. And a second tuned circuit 114 is coupled to node 115 between the output of the second stage (STAGE 2) 108 and the input of the third stage (STAGE 3) 110. In addition, a first bias regulator (BIAS1) 122 is coupled to provide bias conditions to the first stage (STAGE 1) 106. A second bias regulator (BIAS2) 124 is coupled to provide bias conditions to the second stage (STAGE 2) 108. And a third bias regular (BIAS3) 126 is coupled to provide bias conditions to the third stage (STAGE 3) 110. The tuned circuits 112 and 114 and bias regulators 122, 124 and 126 are configured with fixed parameters during fabrication of the PA to achieve optimum performance by the PA once manufactured.

Although these tuning/bias settings are helpful in improving the performance of the PA, problems arise due to inconsistencies in the manufacturing process between different PA parts. Because the tuning and biasing of the amplifier stages are fixed for the PA design during fabrication, these manufacturing process variations from part to part result in PA performance variations from part to part. These performance variations can result in significant yield loss if the manufacturing process variations are large enough. In addition, these manufacturing process variations can make it difficult to determine the proper settings during the design cycle of PAs, because these design cycles can generally require many revisions as these tuning/biasing parameters are modified and tweaked to obtain optimum performance.

In recent years, one-time-programmable (OTP) memory cells have become available in many standard CMOS processes. For examples, suppliers such as Kilopass and Ememory have OTP memory cells from 16 bits to hundreds of kilo-bits that can be embedded into CMOS designs. As such, analog and digital CMOS designs have been able to taken advantage of OTP memories to allow one-time factoring trimming of CMOS integrated circuit designs. However, these OTP memories have not before been used with RF power amplifiers.

SUMMARY OF THE INVENTION

CMOS power amplifiers (PAs) are disclosed having integrated one-time programming (OTP) memories that are utilized to control at least in part the operation of the CMOS power amplifiers. These integrated OTP memories thereby allow adjustments, such as one-time factory trimming, of CMOS power amplifier integrated circuits to optimize or improve performance. With this capability, for example, the tuning and biasing of stages within multi-stage amplifiers within CMOS power amplifier integrated circuits can be measured during factory test and adjusted by setting OTP bits as desired. Further, other circuitry within the CMOS power amplifier can also be controlled at least in part with parameter settings stored in the OTP memory integrated with the CMOS power amplifier. If desired, other features and variations can be implemented, and related systems and methods can be utilized, as well.

In one embodiment, a CMOS power amplifier is disclosed that includes one or more amplifier stages configured to receive a radio frequency (RF) signal and to generate an amplified RF output signal, one or more one-time programmable (OTP) memories configured to store one or more parameter settings configured to control at least in part operation of the CMOS power amplifier, and OTP control circuitry configured to receive control signals from an external device and to program the one or more OTP memories to store the one or more parameter settings, where the one or more amplifier stages and the one or more OTP memories are fabricated using CMOS processing and are integrated on the same integrated circuit. If desired, other features and variations can be implemented, and related systems and methods can be utilized, as well.

In further embodiments, the CMOS power amplifier can include multiple amplifier stages to form a multi-stage amplifier. The CMOS power amplifier can further include one or more bias regulators configured to provide bias settings to the multi-stage amplifier, where the one or more parameter settings are configured to control at least in part operation of the one or more bias regulators. Still further, the CMOS power amplifier can include one or more tuned circuits associated with amplifier stages for the multi-stage amplifier, where the one or more parameter settings are configured to control at least in part operation of the one or more tuned circuits. In addition, the one or more OTP memories can be configured to store one or more parameter settings configured to control other circuitry and/or features related to the operation of the CMOS power amplifier. If desired, other features and variations can be implemented, and related systems and methods can be utilized, as well.

DESCRIPTION OF THE DRAWINGS

It is noted that the appended drawings illustrate only exemplary embodiments of the invention and are, therefore, not to be considered limiting of its scope, for the invention may admit to other equally effective embodiments.

DETAILED DESCRIPTION OF THE INVENTION

CMOS power amplifiers (PAs) are disclosed having one or more integrated one-time programming (OTP) memories that are utilized to control at least in part the operation of the CMOS PAs. As described herein, one or more integrated OTP memories are included on the same integrated circuit as a CMOS power amplifier (PA) to allow adjustments, such as one-time factory trimming, of the PA device to optimize or improve performance. With this capability, for example, the tuning and biasing of stages within multi-stage amplifiers within PAs can be measured during factory test and adjusted by setting OTP bits as desired. Further, other circuitry within the PA can also be controlled at least in part with parameter settings stored in the OTP memory. The OTP memories are integrated on the same integrated circuit as the CMOS PA integrated circuit and can be implemented as multiple OTP memory blocks or as a single OTP memory block, as desired.

It is noted that CMOS PAs that may utilize the integrated OTP memory embodiments described herein include CMOS PAs described in the following applications: U.S. patent application Ser. No. 12/151,199, entitled "Controlling Power with an Output Network" and filed May 5, 2008 (now published as U.S. Published Patent Application 2009-0273397), and U.S. patent application Ser. No. 12/151,812, entitled "Supply Control For Multiple Power Modes Of A Power Amplifier" and filed May 8, 2008 (now published as U.S. Published Patent Application 2009-0278609), each of which is hereby incorporated by reference in its entirety.

It is further noted that for CMOS PAs used in cellular telephone handsets, the input RF frequencies for the CMOS PAs are typically above 600 MHz and often above 800 MHz.

Figure 1:
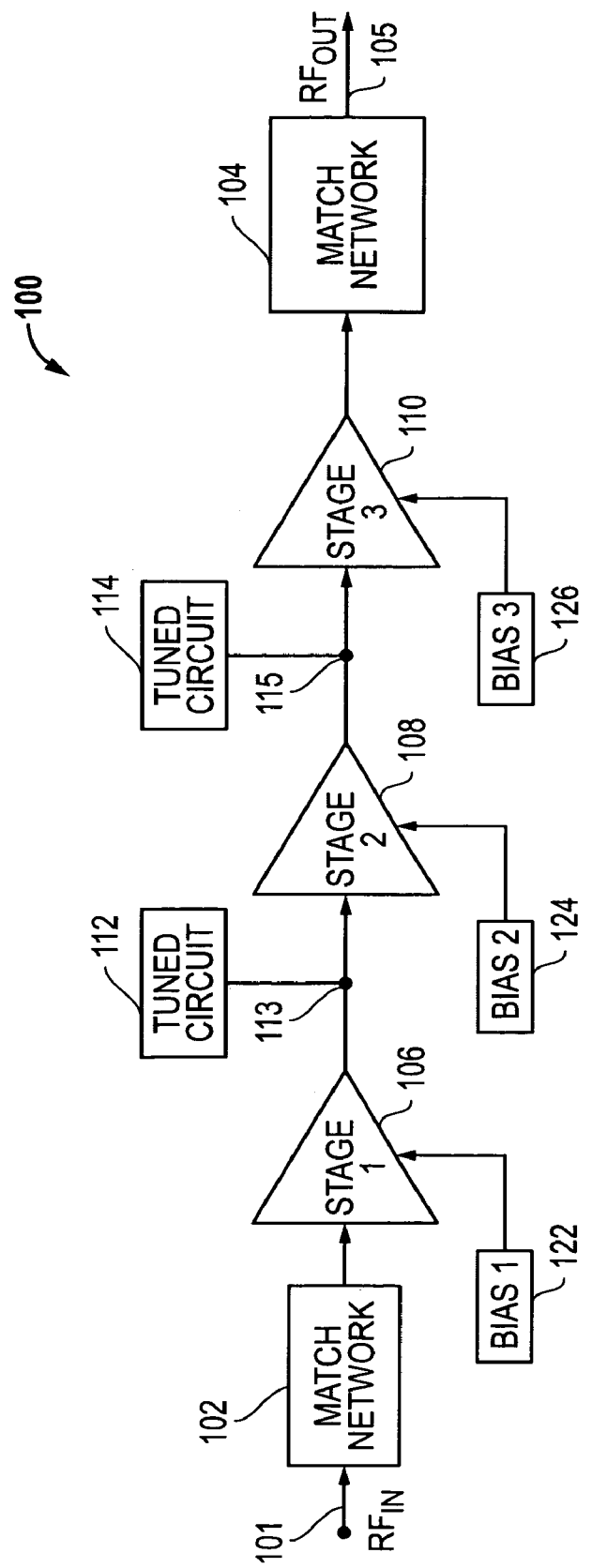
FIG. 1 (Prior Art) is a block diagram of multiple amplifier stages for a prior power amplifier (PA) that utilizes fixed tuning/biasing parameters.
Figure 2:
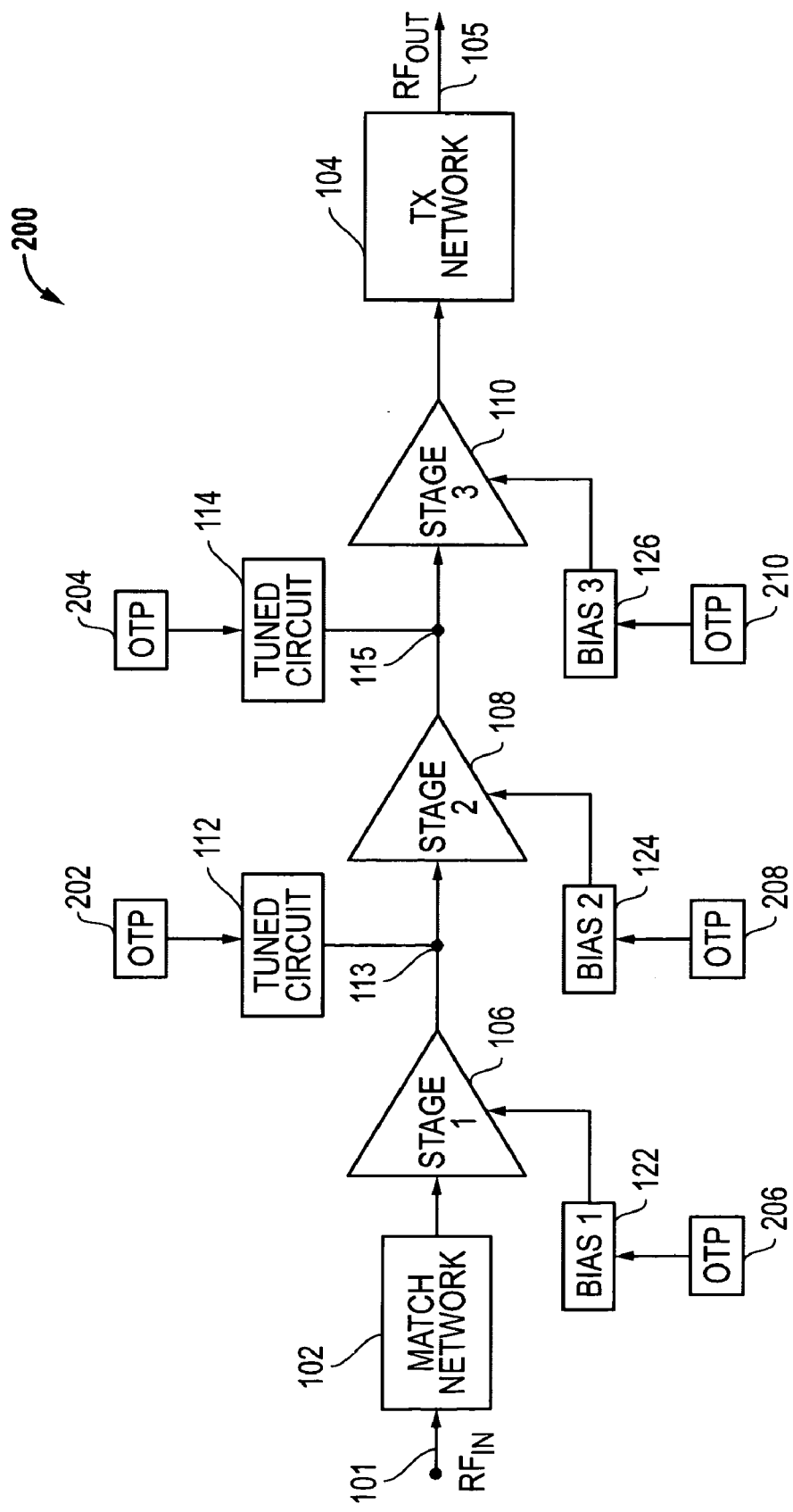
FIG. 2 is a block diagram of multiple amplifier stages for a CMOS power amplifier (PA) having integrated one-time-programmable (OTP) memories that allow for programmable setting of tuning/biasing parameters.

FIG. 2 is a block diagram for an embodiment 200 of multiple amplifier stages for an integrated CMOS power amplifier (PA) having integrated one-time-programmable (OTP) memories that allow for programmable setting of tuning/biasing parameters. Embodiment 200 is similar to embodiment 100 of FIG. 1 (Prior Art) except that the tuned circuits 112 and 114, as well as the bias regulators 122, 124 and 126, are controlled at least in part by parameters set in the OTP memories. As depicted, OTP memory 202 stores parameter settings configured to control at least in part the first tuned circuit 112. OTP memory 204 stores parameter settings configured to control at least in part the second tuned circuit 114. OTP memory 206 stores parameter settings configured to control at least in part the first bias regulator (BIAS1) 122. OTP memory 208 stores parameter settings configured to control at least in part the second bias regulator (BIAS2) 124. And OTP memory 210 stores parameter settings configured to control at least in part the third bias regulator (BIAS3) 126. It is noted that the integrated OTP memories 202, 204, 206, 208 and 210 can be implemented as different physical OTP memory blocks or as a single OTP memory block, as desired.

Figure 3:
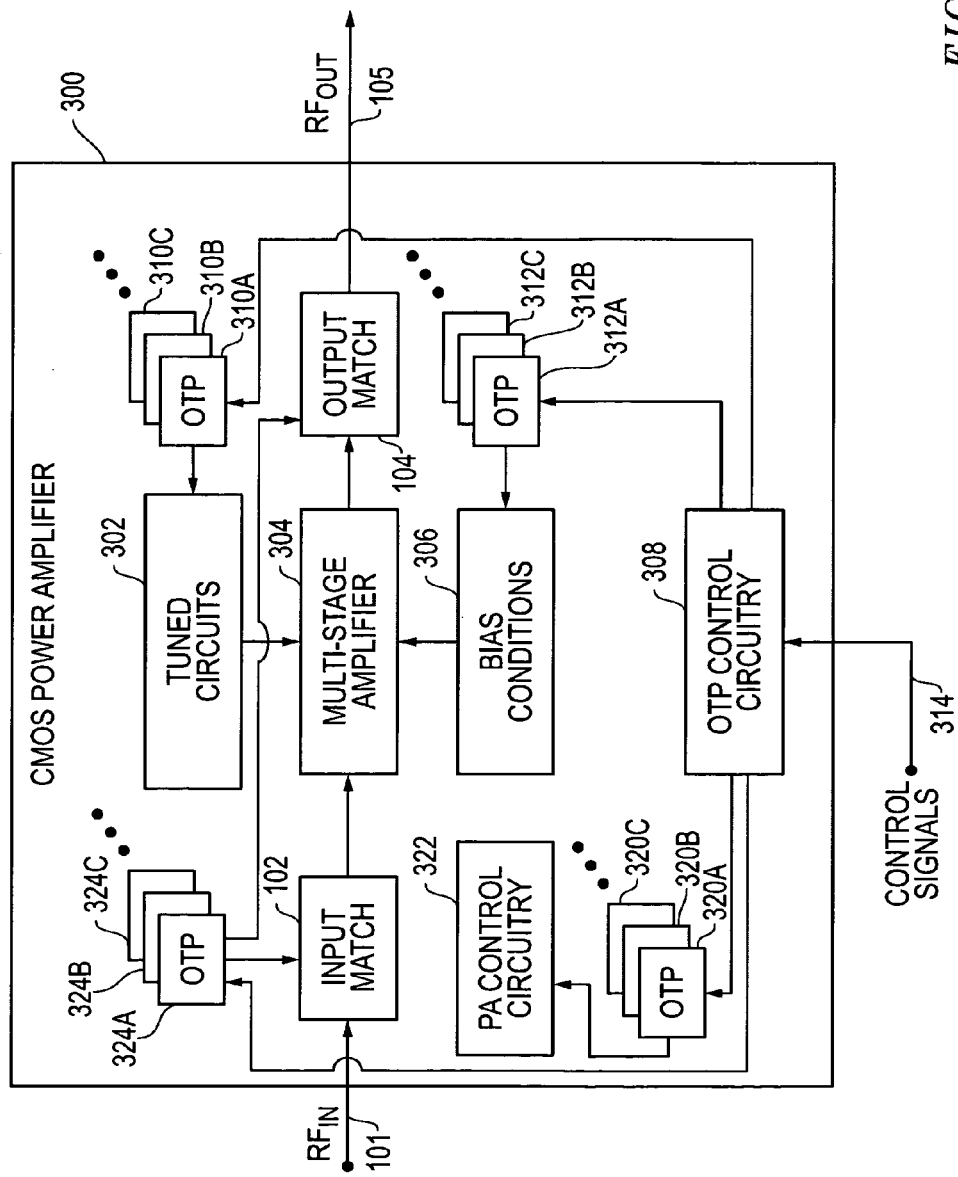
FIG. 3 is a block diagram for a CMOS power amplifier (PA) utilizing integrated one-time-programmable (OTP) memories.

FIG. 3 is a block diagram for a CMOS power amplifier (PA) 300 utilizing integrated one-time-programmable (OTP) memories. As depicted, the RF input ($RF_{IN}$) 101 is received by the input match network 102 and then provided to the multi-stage amplifier 304. The output of the multi-stage amplifier 304 is then provided to the output match network 104, which in turn outputs the RF output ($RF_{OUT}$) 105. As discussed above, the performance of the multi-stage amplifier 304 can be optimized or improved using tuned circuits 302 and bias regulators 306. And as described above, the tuned circuits 302 can be at least in part controlled by parameter settings written to and stored in one or more OTP memories 310A, 310B, 310C.... Similarly, the bias regulators 306 can be at least in part controlled by parameter settings written to and stored in one or more OTP memories 312A, 312B, 312C....

It is noted that the programming of the OTP memories 310A, 310B, 310C... and 312A, 312B, 312C... can be controlled by OTP control circuitry 308, which in turn receives controls signals 314 through an external interface for the CMOS power amplifier (PA) 300. After fabrication of the CMOS PA 300 using CMOS processing, the OTP memories can be written or programmed by communicating the desired data to be written to the OTP control circuitry 308. Once programmed, the CMOS PA 300 can then be provided to customers for operation in end-user devices.

It is further noted that one or more additional OTP memories 320A, 320B, 320C... can also be associated with PA control circuitry 322 and can provide other programmable parameter settings for the operation of the CMOS PA 300, as desired. For example, OTP memories 324A, 324B, 324C... can be included to provide programmable settings for the input match circuitry 102 and/or the output match circuitry 104. Thus, in addition to the tuned circuits and bias regulators, other circuitry within the PA may also be controlled in part using the one or more OTP memories. For example, LDO (low drop-out) regulator voltage settings, linearity compensation settings, input match circuitry adjustment, output match circuitry adjustment for the transmit network and/or other configurations or operational features for the CMOS PA 300 can be controlled at least in part using the OTP memories. It is again noted that the OTP memories integrated on the same integrated circuit as the CMOS PA can be implemented as separate OTP memory blocks or as a single OTP memory block, as desired.

Figure 4:
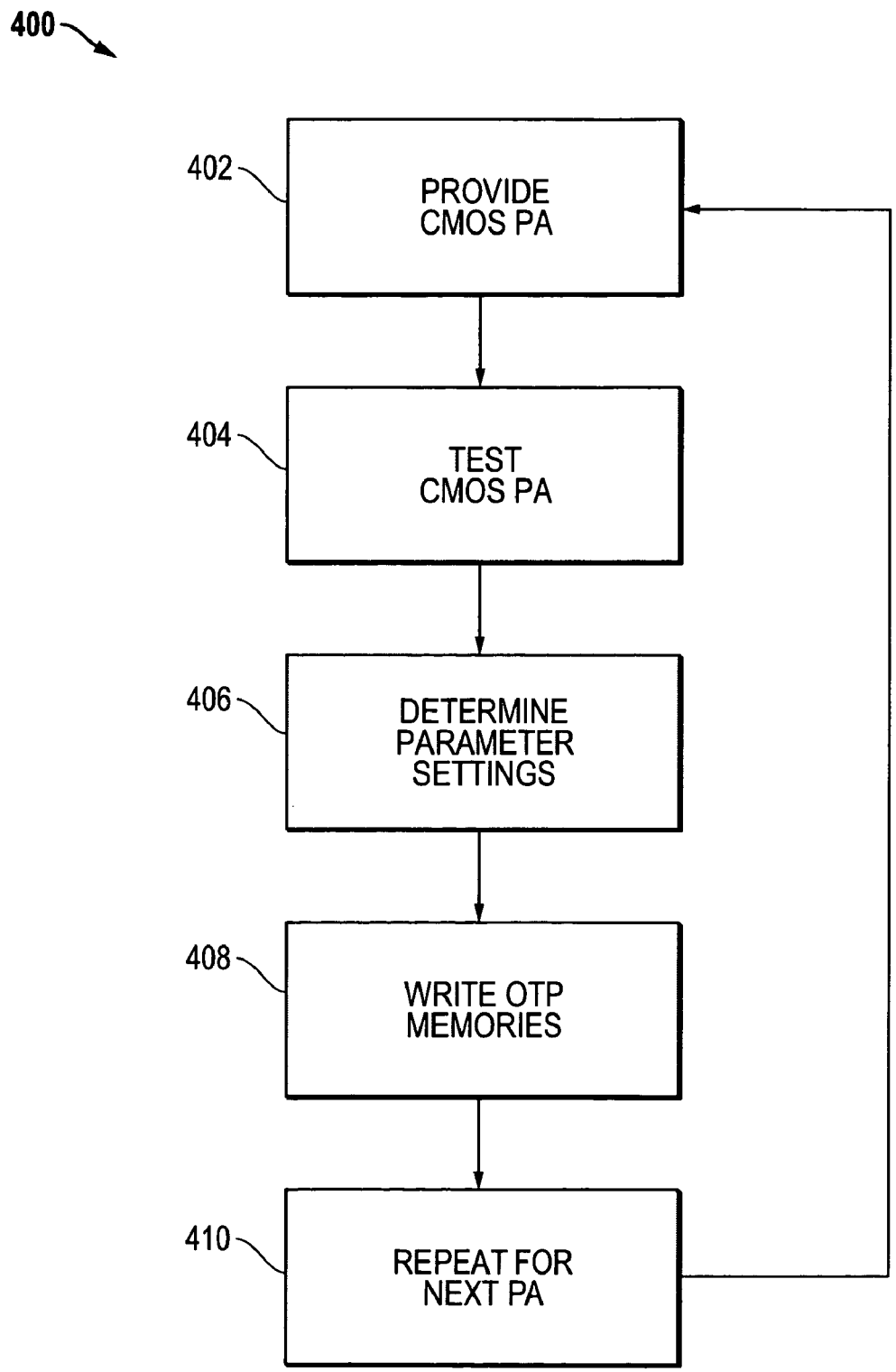
FIG. 4 is a process diagram for writing the parameter settings stored in the integrated one-time-programmable (OTP) memories.

FIG. 4 is a process diagram of an embodiment 400 for writing the parameter settings stored in the integrated one-time-programmable (OTP) memories. In block 402, a CMOS power amplifier (PA) is provided with one or more integrated OTP memories. In block 404, the PA is tested. In block 406, the desired parameter settings are determined based upon the testing and/or other considerations. In block 408, the one or more OTP memories are written so that the parameter settings are stored within the OTP memories. Finally, in block 410, the process is repeated for the next PA. In this way, if desired, each PA that is manufactured can be separately optimized based upon parameter settings written to the OTP memories for the PA.

It is noted that this use of one or more OTP memories is also advantageous for testing various configurations for the PA parts during design cycles. Samples of the CMOS PAs can be programmed with different tuning/biasing parameter settings or other operational settings using the OTP memory. These differently programmed PAs can then be tested to see which settings provide the best results. As such, many different configurations can be rapidly tested rather than having to produce a new revision of the part for each desired configuration.

As described above, the one or more CMOS OTP memories can be implemented as a different OTP memory blocks or a single OTP memory block, as desired. It is further noted that the OTP memories can be implemented using a wide variety of structures and sizes, as desired.

In one embodiment, for example, the OTP memories can be implemented as three 16-bit OTP registers that are used to store PA parameter settings. TABLE 1 below provides one example for parameters for which settings may be stored by these OTP memories. It is noted, however, that the parameters identified in TABLE 1 are included as examples only. Other or different parameters could be set, selected and/or stored using the OTP memories, as desired, depending upon the operational parameters desired to be adjusted or controlled.

TABLE 1

EXAMPLE PARAMETERS FOR OTP MEMORIES

| Example Parameter Description | Example Number of Bits |
|---|---|
| Mode configuration - selects operational mode for the PA | 4 bits |
| LDO - sets LDO voltage regulator adjustments for the PA | 3 bits |
| Band gap - sets band gap voltage adjustments for the PA | 3 bits |
| Linearity compensation - sets adjustments for linearity compensation | 13 bits |
| Stage bias current - sets stage bias current trim adjustments for multiple amplifier stages | 12 bits |
| Inter-stage match tuning - sets match tuning adjustments for multiple amplifier stages | 12 bits |
| OTP enable bit 0 - Defaults selected 1- Programmed values selected | 1 bit |

It is further noted that the parameter settings can be configured to each have a default value, and one or more bits in the OTP memories can be used to indicate whether or not these default values should be used. For example, as set forth in TABLE 1, all of the default values can be selected by setting the OTP enable bit to "0," and the programmed values can be selected by setting the OTP enable bit to "1." Thus, the OTP memories can be configured to output the default values or to output the programmed values depending upon the setting of the OTP enable bit. In one implementation, for example, the OTP enable bit can be used to control a multiplexer that is configured to select the output of the OTP registers or the default values, which can be hard-wired within the CMOS PA, if desired. It is further noted that the OTP enable bit can default to a "0" state unless otherwise programmed and that non-programmed OTP bits can also be configured to default to a "0" state unless otherwise programmed.

Further modifications and alternative embodiments of this invention will be apparent to those skilled in the art in view of this description. It will be recognized, therefore, that the present invention is not limited by these example arrangements. Accordingly, this description is to be construed as illustrative only and is for the purpose of teaching those skilled in the art the manner of carrying out the invention. It is to be understood that the forms of the invention herein shown and described are to be taken as the presently preferred embodiments. Various changes may be made in the implementations and architectures. For example, equivalent elements may be substituted for those illustrated and described herein, and certain features of the invention may be utilized independently of the use of other features, all as would be apparent to one skilled in the art after having the benefit of this description of the invention.

What is claimed is:

1. A CMOS power amplifier, comprising:
a plurality of amplifier stages configured to receive a radio frequency (RF) signal and to generate an amplified RF output signal, the plurality of amplifier stages forming a multi-stage amplifier and being configured to receive an RF signal above 600 MHz; and
one or more one-time programmable (OTP) memories programmed to store one or more parameter settings configured to control at least in part operation of the plurality of amplifier stages for the CMOS power amplifier, the one or more parameter settings being based upon factory test of the CMOS power amplifier after its fabrication and being configured to improve performance of the CMOS power amplifier in an end-user device;
wherein the amplifier stages and the one or more OTP memories are fabricated using CMOS processing and are integrated on the same integrated circuit.

2. The CMOS power amplifier of claim 1, wherein the multi-stage amplifier comprises at least three amplifier stages.

3. The CMOS power amplifier of claim 1, further comprising one or more bias regulators configured to provide bias settings to the multi-stage amplifier, and wherein the one or more parameter settings are configured to control at least in part operation of the one or more bias regulators.

4. The CMOS power amplifier of claim 1, further comprising one or more tuned circuits associated with amplifier stages for the multi-stage amplifier, and wherein the one or more parameter settings are configured to control at least in part operation of the one or more tuned circuits.

5. The CMOS power amplifier of claim 1, further comprising an input match network coupled to receive an RF input signal and to output the RF signal to the amplifier stages, and an output match network coupled to receive the amplified RF output signal and to provide an RF output signal for transmission by an antenna.

6. The CMOS power amplifier of claim 1, wherein the one or more OTP memories comprise a plurality of OTP memories.

7. The CMOS power amplifier of claim 6, wherein the plurality of OTP memories comprise a plurality of multiple-bit OTP registers.

8. The CMOS power amplifier of claim 1, wherein the one or more OTP memories include at least one bit configured to indicate whether default parameter settings are to be used.

9. The CMOS power amplifier of claim 1, further comprising power amplifier control circuitry configured to receive parameter settings from the one or more OTP memories.

10. A CMOS power amplifier, comprising:
a plurality of amplifier stages configured to receive a radio frequency (RF) signal and to generate an amplified RF output signal, the plurality of amplifier stages forming a multi-stage amplifier and being configured to receive an RF signal above 600 MHz;
one or more one-time programmable (OTP) memories; and
OTP control circuitry configured to receive control signals from an external device and to program the one or more OTP memories to store one or more parameter settings, the parameter settings being configured to control at least in part operation of the plurality of amplifier stages for the CMOS power amplifier, the one or more parameter settings being configured to be based upon factory test of the CMOS power amplifier after its fabrication and being configured to improve performance of the CMOS power amplifier in an end-user device;

wherein the amplifier stages, the one or more OTP memories and the OTP control circuitry are fabricated using CMOS processing and are integrated on the same integrated circuit.

11. The CMOS power amplifier of claim 10, further comprising one or more bias regulators configured to provide bias settings to the multi-stage amplifier, and wherein the one or more parameter settings are configured to control at least in part operation of the one or more bias regulators.

12. The CMOS power amplifier of claim 10, further comprising one or more tuned circuits associated with amplifier stages for the multi-stage amplifier, and wherein the one or more parameter settings are configured to control at least in part operation of the one or more tuned circuits.

13. The CMOS power amplifier of claim 10, wherein the one or more OTP memories comprise a plurality of OTP memories.

14. A method for operating a CMOS power amplifier, comprising:

receiving a radio frequency (RF) signal above 600 MHz with a CMOS power amplifier, the CMOS power amplifier having a plurality of amplifier stages forming a multi-stage amplifier and one or more one-time programmable (OTP) memories fabricated using CMOS processing and integrated on the same integrated circuit, the one or more OTP memories being programmed to store one or more parameter settings configured to control at least in part operation of the plurality of amplifier stages for the CMOS power amplifier, and the one or more parameter settings being based upon factory test of the CMOS power amplifier after its fabrication and being configured to improve performance of the CMOS power amplifier in an end-user device; and generating an amplified RF output signal above 600 MHz with the CMOS power amplifier utilizing the one or more parameter settings within the one or more OTP memories to control at least in part operation of the CMOS power amplifier.

15. The method of claim 14, wherein the receiving step comprises receiving the RF signal with a CMOS power amplifier having at least three amplifier stages.

16. The method of claim 14, further comprising biasing the amplifier stages for the multi-stage amplifier using one or more bias regulators, wherein the one or more parameter settings control at least in part operation of the one or more bias regulators.

17. The method of claim 14, further comprising tuning the amplifier stages for the multi-stage amplifier using one or more tuned circuits, wherein the one or more parameter settings control at least in part operation of the one or more tuned circuits.

18. The method of claim 14, further comprising sending the amplified RF output signal to a transmit antenna.

19. The method of claim 14, wherein the receiving step comprises receiving the RF signal with a CMOS power amplifier having a plurality of OTP memories.

20. The method of claim 19, wherein the receiving step comprises receiving the RF signal with a CMOS power amplifier having a plurality of multiple-bit OTP registers.

21. The method of claim 14, wherein the receiving step comprises receiving the RF signal with a CMOS power amplifier that utilizes at least one bit within the one or more OTP memories to indicate whether default parameter settings are used.

22. A method for configuring a CMOS power amplifier, comprising:

providing a CMOS power amplifier having a plurality of amplifier stages forming a multi-stage amplifier and one or more one-time programmable (OTP) memories fabricated using CMOS processing and integrated on the same integrated circuit, the amplifier stages being configured to receive a radio frequency (RF) signal above 600 MHz and to generate an amplified RF output signal above 600 MHz; and writing one or more parameter settings to the one or more OTP memories, the one or more parameter settings being configured to control at least in part operation of the plurality of amplifier stages for the CMOS power amplifier, and the one or more parameter settings being based upon factory test of the CMOS power amplifier after its fabrication and being configured to improve performance of the CMOS power amplifier in an end-user device.

23. The method of claim 22, wherein the providing step comprises providing a CMOS power amplifier having one or more bias regulators configured to provide bias settings to the multi-stage amplifier and wherein the one or more parameter settings are configured to control at least in part operation of the one or more bias regulators.

24. The method of claim 22, wherein the providing step comprises providing a CMOS power amplifier having one or more tune circuits configured to tune the multi-stage amplifier and wherein the one or more parameter settings are configured to control at least in part operation of one or more tuned circuits.

25. The method of claim 22, wherein the providing step comprises providing a CMOS power amplifier having a plurality of OTP memories.

* * * * *